US008006370B2

(12) United States Patent
Hoffmann et al.

(10) Patent No.: US 8,006,370 B2
(45) Date of Patent: Aug. 30, 2011

(54) METHOD FOR SEALING A HOUSING

(75) Inventors: Ralf Hoffmann, Berlin (DE); Alexander Linke, Berlin (DE); Martin Wieberger, Berlin (DE); Titus Ziegler, Berlin (DE)

(73) Assignee: Tyco Electronics AMP GmbH, Bensheim (DE)

( * ) Notice: Subject to any disclaimer, the term of this patent is extended or adjusted under 35 U.S.C. 154(b) by 318 days.

(21) Appl. No.: 12/124,480

(22) Filed: May 21, 2008

(65) Prior Publication Data

US 2008/0296843 A1 Dec. 4, 2008

(30) Foreign Application Priority Data

May 31, 2007 (DE) ......................... 10 2007 025 338

(51) Int. Cl.
*H01F 7/06* (2006.01)

(52) U.S. Cl. ........... 29/602.1; 29/606; 335/80; 335/151; 335/152; 335/153

(58) Field of Classification Search ................. 29/602.1, 29/606; 335/80, 151, 152, 153
See application file for complete search history.

(56) References Cited

U.S. PATENT DOCUMENTS 4,177,439 A * 12/1979 Smith .......................... 335/151
4,195,276 A * 3/1980 Rauterberg ................... 335/151
4,230,901 A * 10/1980 Wengler et al. ............... 174/564
4,311,976 A * 1/1982 Sauer et al. ..................... 335/78
4,345,805 A * 8/1982 Finley et al. .................. 439/191
4,577,172 A * 3/1986 Schedele et al. ................ 335/80
4,577,173 A * 3/1986 Schedele et al. ................ 335/80
4,611,392 A * 9/1986 Bell ............................ 29/602.1
4,731,597 A * 3/1988 Hinrichs ....................... 335/128
4,742,610 A * 5/1988 Kimpel et al. ............... 29/602.1
4,951,016 A * 8/1990 Furtwaengler et al. ......... 335/80
5,008,641 A * 4/1991 Schedele ......................... 335/80
6,266,867 B1 * 7/2001 Kern ........................... 29/602.1
6,272,734 B1 * 8/2001 Kern ........................... 29/602.1

FOREIGN PATENT DOCUMENTS

DE 29 42 258 C2 6/1989
DE 90 11 111.7 U1 1/1992
DE 20 2005 016 473 U1 3/2006

* cited by examiner

*Primary Examiner* — C. J Arbes
(74) *Attorney, Agent, or Firm* — Barley Snyder

(57) ABSTRACT

A method for sealing a housing includes providing a base plate of the housing with at least one opening; providing an electrical connection that extends through the base plate from an inner side to an outer side of the base plate; and applying a sealing compound into the opening from an outer side of the base plate in order to seal an interface between the base plate and the electrical connection.

16 Claims, 6 Drawing Sheets

10
18
18
16
16
12
16
12
11
11
14

METHOD FOR SEALING A HOUSING

CROSS-REFERENCE TO RELATED APPLICATIONS

This application claims the benefit of the filing date under 35 U.S.C. §119(a)-(d) of German Patent Application No. DE 10 2007 025 338.0, filed May 31, 2007.

FIELD OF THE INVENTION

The present invention relates to a method for sealing a housing provided with an electrical connection.

BACKGROUND

When producing microswitches for use in vehicles there is, for example, a requirement to adhesively bond the housing to the base and simultaneously to seal the connecting pins. The housings and the electrical connections leading out of the housings are sealed with a sealing compound. The housings may include, for example, caps and headers, and the electrical connections may include, for example, connecting pins.

In this method, a meniscus is formed at the interfaces of the individual components due to capillary action. When the sealing compound is metered and added to the exterior of the housing, said meniscus is larger since the sealing compound itself initially has a minimum height on top of which the meniscus forms. If the sealing compound is applied in the direct vicinity of the interfaces on which the seal is required, the meniscus increases in height due to separation drops.

Meniscus formation causes problems during the tin-plating process since solder beads may form due to the menisci. The solder beads cannot be readily found when checking the relay since they can generally move freely and therefore cannot always be located. For this reason manufacturing methods must be found which are able to prevent the formation of solder balls. The fact that the close contact between the connecting pins and their counterparts is no longer readily provided due to meniscus formation is also a disadvantage.

Until now, attempts to solve the problems of meniscus formation have involved conveying the sealing compound to the interface (for example a pin through the header) by means of conveying channels or ribs. In this case, capillary action is used to guide the sealing compound along the conveying channels or ribs to the interface to be sealed in order to then seal said surface.

Another proposed solution provides that the entire base area is structured. This means that the sealant or sealing compound spreads over the base plate by capillary action and thus also reaches the connections. This proposed solution requires that the sealant has an extremely low level of viscosity and that there are only very small gaps between the connecting pin and the housing. This has the drawback that very low component tolerances are required.

SUMMARY

The object of the invention is therefore to provide an improved method for sealing an electrical component, and also to provide an electrical component that is able to prevent meniscus formation and the consequences thereof.

This and other objects are achieved by a method for sealing a housing comprising: providing a base plate of the housing with at least one opening; providing an electrical connection that extends through the base plate from an inner side to an outer side of the base plate; and applying a sealing compound into the opening from an outer side of the base plate in order to seal an interface between the base plate and the electrical connection.

LED DESCRIPTION OF THE EMBODIMENT(S)

Figure 1:
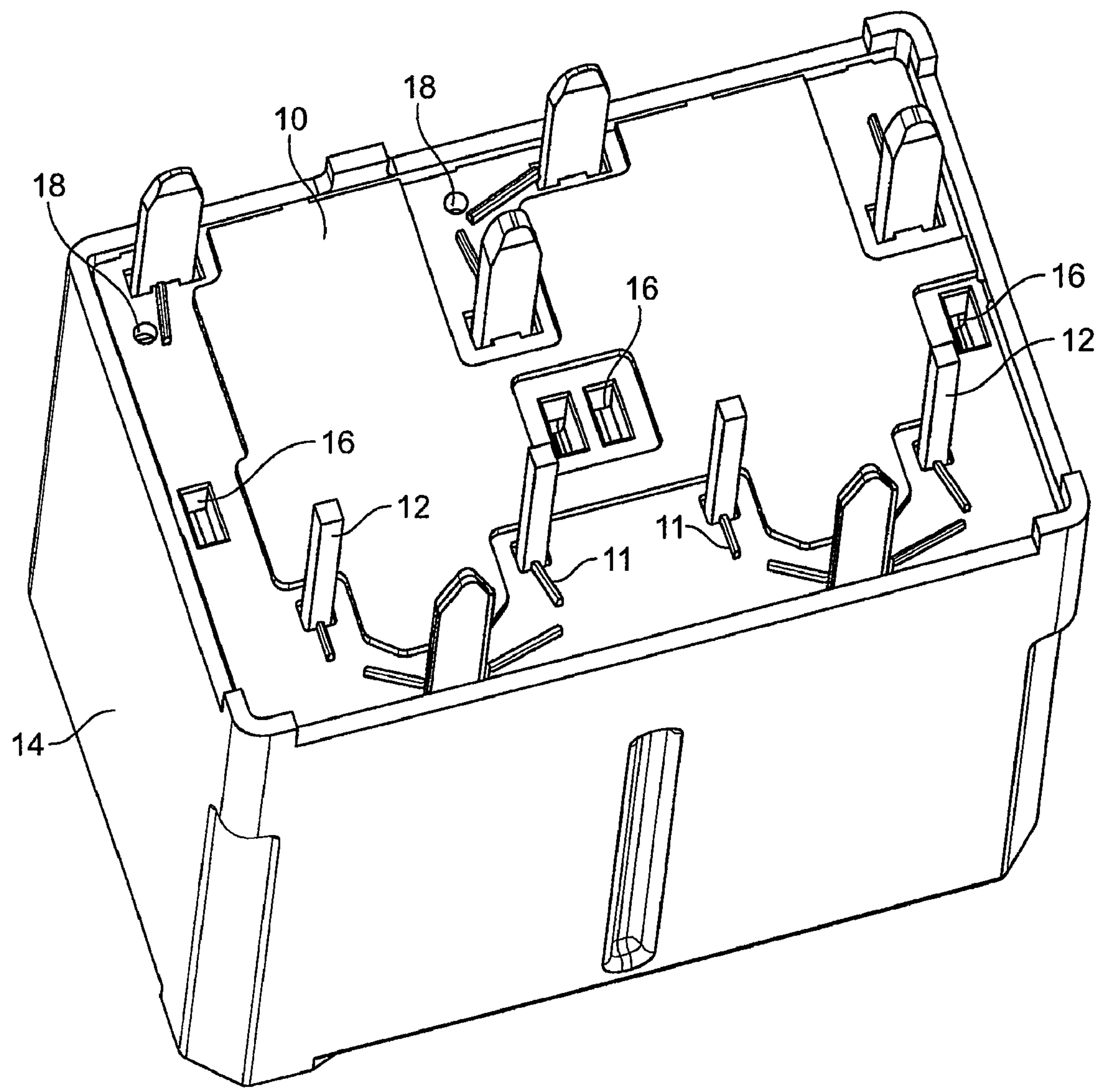
FIG. 1 is a perspective view of an electromagnetic relay according to the invention.
Figure 2:
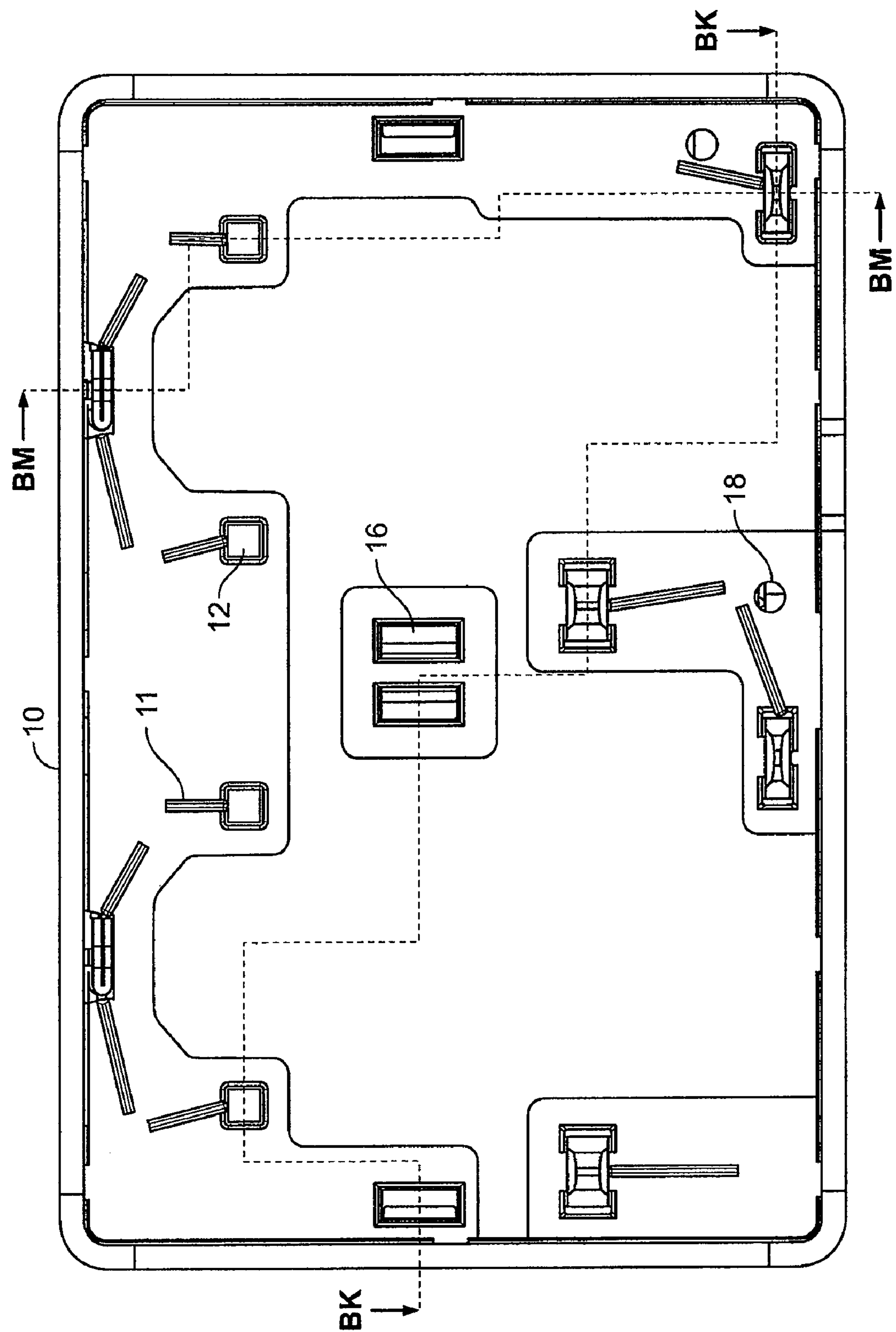
FIG. 2 is a plan view of an underneath of the electromagnetic relay according to the invention.
Figure 3:
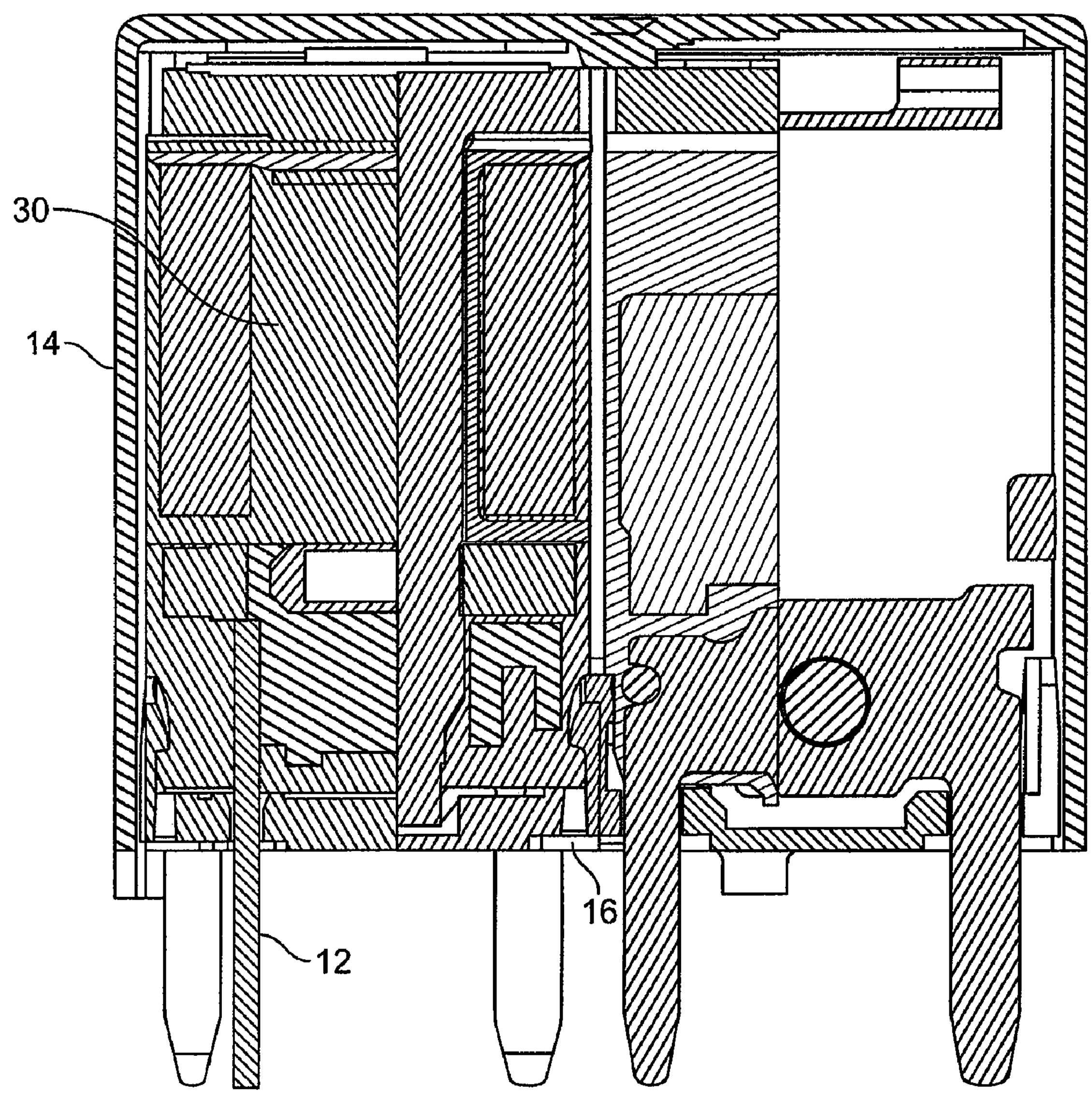
FIG. 3 is a lateral sectional view taken along line BK-BK of FIG. 2.
Figure 4:
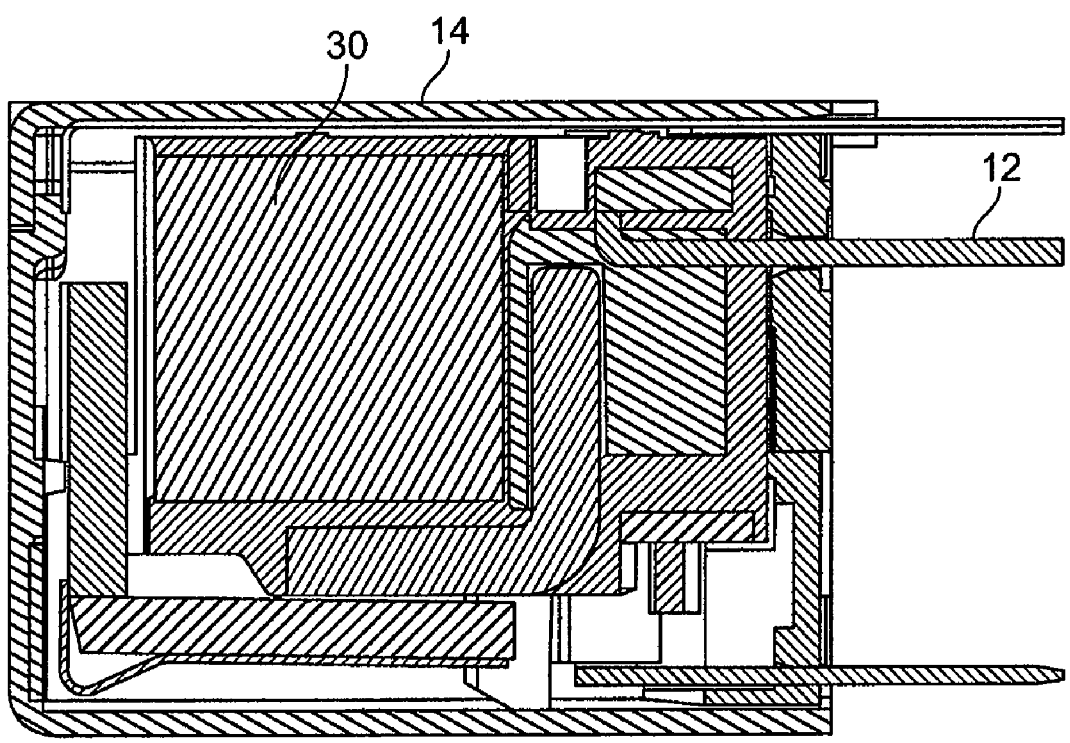
FIG. 4 is a cross-sectional view taken along line BM-BM of FIG. 2.
Figure 5:
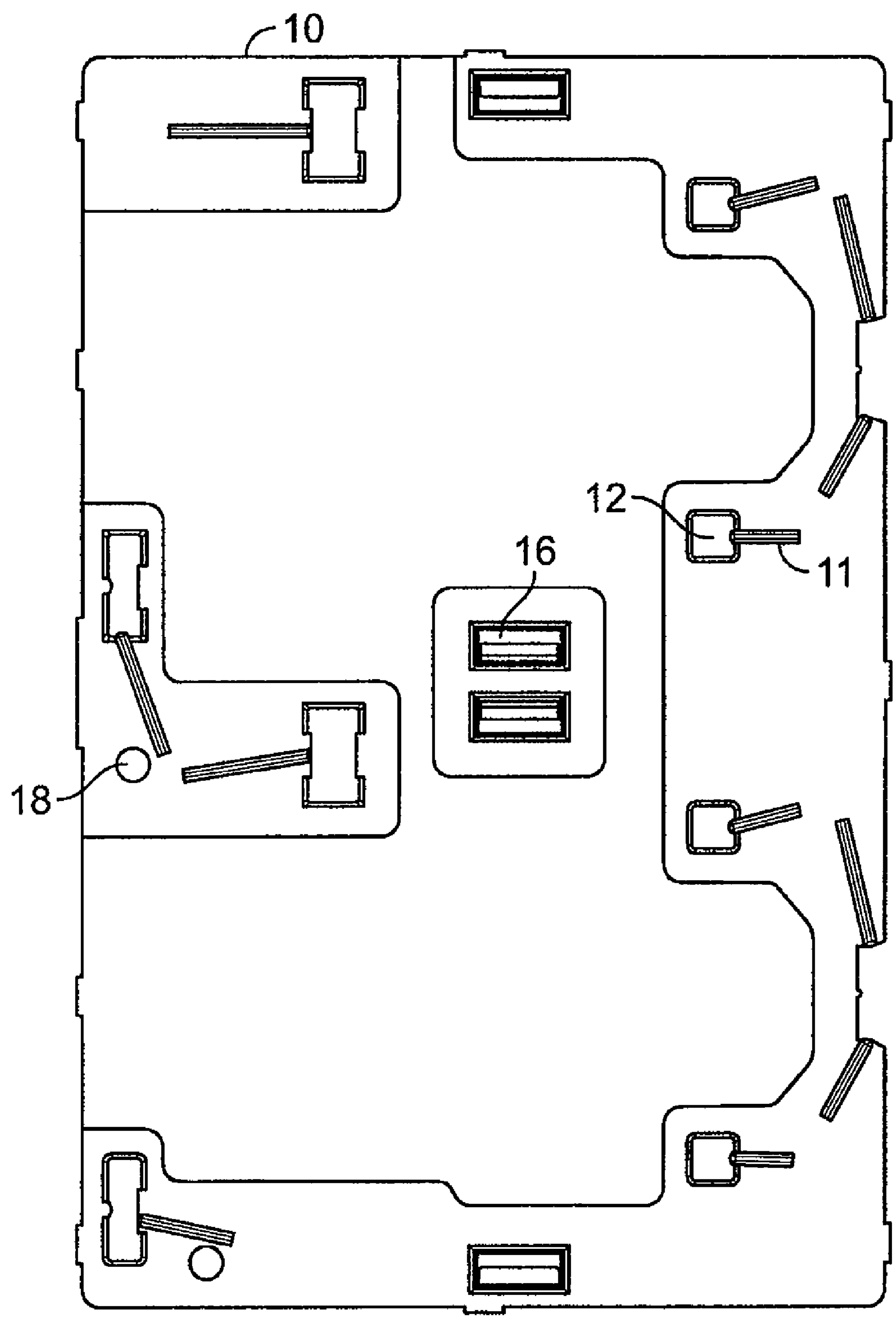
FIG. 5 is a plan view of a base plate of the electromagnetic relay according to the invention viewed from an exterior.
Figure 6:
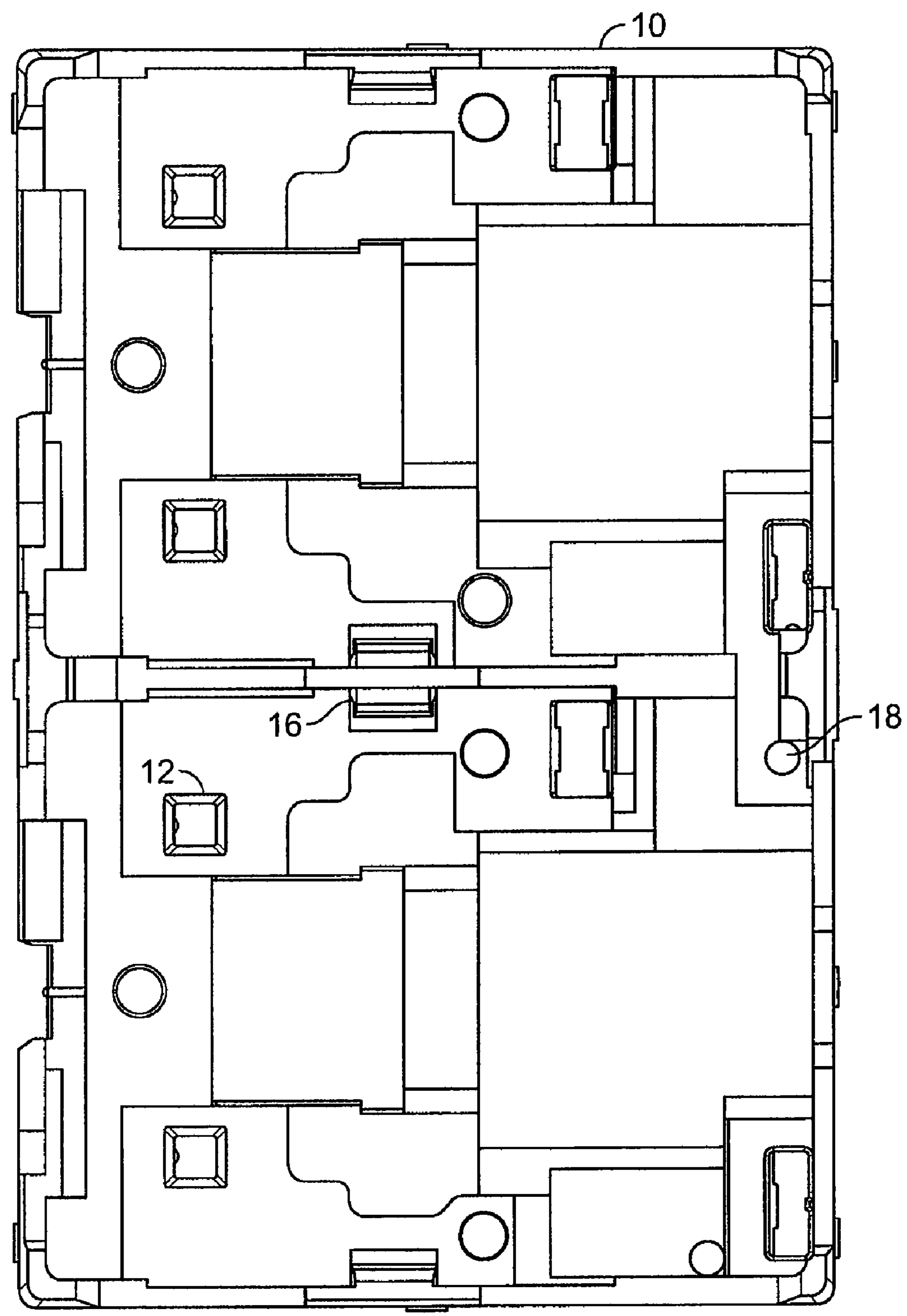
FIG. 6 is a plan view of the base plate of the electromagnetic relay according to the invention viewed from an interior.

FIG. 1 shows an electrical component illustrated herein as an electromagnetic relay 14 according to an embodiment of the invention. As shown in FIG. 1, the electromagnetic relay 2 includes a housing with a base plate 10. As shown in FIG. 2, the base plate 10 has a plurality of openings for receiving electrical connections or pins 12, a plurality of openings 16 for receiving latches, and a plurality of openings 18 for applying a sealing compound. The openings 16, 18 are arranged remote from the pins 12. As shown in FIGS. 3 and 4, the electromagnetic relay 14 includes a coil form 30, which is delimited by a wall. A lower side of the wall defines, together with an inner surface of the base plate 10, a gap into which the sealing compound is introduced. The gap extends substantially transverse to the openings 16, 18. The structure of the base plate 10 is structured during the manufacturing process to guide the sealing compound to the pins 12. For example, ribs 11 may be provided on an outer side of the base plate 10 to convey the sealing compound to an interface between the pins 12 and the base plate 10 via a capillary action.

A method for sealing the housing of the electromagnetic relay 14 will now be described in more detail. Since applying the sealing compound from an exterior of the housing onto the base plate 10 always leads to meniscus formation which cannot be reduced any further with conventional techniques, the solution according to the invention provides a different proposal. According to the invention, the sealing compound is applied to the interface from an inner side of the base plate 10. In this case, capillary action takes place in such a way that the sealing compound is guided to the pins 12, and a free space between the base plate 10 and the pins 12 is filled. For this purpose, a gap is provided between the base plate 10 and the coil form 30 (or other structure) located in the interior of the electromagnetic relay 14. The gap causes the sealing compound to be rapidly transported to the pins 12, to flow around the pins 12 from the interior and to seal the pins 12 up to the base plate 10. The meniscus which forms outwardly is thus only caused by capillary action and is as small as technically possible.

In order to direct the sealing compound onto the inner side of the base plate 10, the openings 16 and/or the openings 18 are used. In an embodiment of the invention, a third of the sealing compound is introduced through the openings 18, and two thirds of the sealing compound is introduced through the openings 16. As can be seen in FIGS. 1, 2, 5 and 6, the openings 16 have a dual function. They are used both for latch connections and also for pouring in the sealing compound. In contrast, the openings 18 are intended only to have the sealing compound poured into them and therefore must be provided in the design and production stages of the base plate 10.

The openings 16, 18 should be as remote as possible from the pins 12 in order to minimize meniscus formation on the pins 12. The distance of the openings 16, 18 from the pins 12 depends, inter alia, on the viscosity of the sealing compound. In principle, the distance should be selected so as to be as large as possible to avoid any meniscus formation on the pins 12. The selection of the sealing compound is influenced by both the desired adhesion properties and effective capillary action. The sealing compound can flow through the openings 16, 18 into the gap behind the base plate 10 and thus ensure sealing, as described above. The sealing compound must furthermore be selected in such a way that it wets and reliably seals both plastic materials and metal.

The sealing compound is applied from the outer side of the base plate 10 in the vicinity of at least one of the openings 16, 18 in order to subsequently flow through the openings 16, 18. Since the openings 16, 18 are remote from the pins 12, the pins 12 are only sealed outwardly from the inner side of the base plate 10, as described above. The sealing compound thus flows substantially parallel to the base plate 10 and therefore transverse to the openings 16, 18. As shown in FIG. 4, the inner side of the base plate 10 comprises edges, channels and ribs, along which the sealing compound is guided by capillary action to the pins 12 in order to subsequently seal the pins 12. Also, edges on the interior are configured so as to be concave in order to support the capillary action. Because the sealing compound is guided within the gap, an excess of the sealing compound in the housing cannot occur.

The viscosity of the sealing compound is significant, since complete wetting and sealing are to be assured. For this reason, constant viscosity and constant flow properties of the adhesive are very important. Narrow viscosity limits in the adhesive allow constant flow characteristics to be achieved. The distance of the openings 16, 18 from the pins 12 is also a function of the viscosity of the sealing compound. In some applications this can be critical since meniscus formation on the pins 12 cannot otherwise be sufficiently controlled.

In an embodiment of the invention, the electromagnetic relay 14 is configured as a surface mount device (SMD), but the pins 12 are nevertheless guided through the openings in the base plate 10. In this case, the soldering paste required for the tin-plating process is 2 mm thick. The adhesive joints are now only located in the interior of the electromagnetic relay 14. If additional adhesive must be applied from the outside, it combines with the adhesive applied from the interior according to the invention. This means that it is no longer necessary to pour adhesive on the outer side of the base plate 10, as is the case in the known techniques.

Since, according to the invention, the sealing compound is no longer applied to the outer side of the base plate 10, this surface is now available for other uses. Information can now be printed on the outer side of the base plate 10, inter alia. This information could contain, for example, the company designation and data on the electromagnetic relay 14.

The foregoing illustrates some of the possibilities for practicing the invention. Many other embodiments are possible within the scope and spirit of the invention. For example, the method of sealing the housing according to the invention can be used for different housings comprising housing walls, in which housings, a component is guided outwards through a housing wall and the housing must be sealed. This includes, for example, latches and electrical connections, but may also relate to base plate flaps on a fitted coil form or a header. It is, therefore, intended that the foregoing description be regarded as illustrative rather than limiting, and that the scope of the invention is given by the appended claims together with their full range of equivalents.

What is claimed is:

1. A method for sealing a housing, comprising:

providing a base plate of the housing with a first opening and a second opening;

providing an electrical connection that extends through the first opening from an inner side to an outer side of the base plate; and applying a sealing compound into the second opening from an outer side of the base plate in order to seal an interface between the base plate and the electrical connection.

2. The method of claim 1, wherein a free space is formed at the interface between the base plate and the electrical connection.

3. The method of claim 1, wherein the second opening receives a latch after the sealing compound is applied.

4. The method of claim 1, wherein the second opening is remote from the electrical connection.

5. The method of claim 1, further comprising guiding the sealing compound to the interface through a gap that extends substantially transverse to the second opening.

6. The method of claim 1, further comprising guiding the sealing compound along an uneven interior surface on the inner side of the base plate to the interface.

7. The method of claim 1, wherein the housing is an electromagnetic relay.

8. The method of claim 1, wherein the sealing compound is compatible with a plastic material and a metal material.

9. The method of claim 1, further comprising providing a coil form on an inner side of the base plate.

10. The method of claim 4, wherein a distance between the second opening and the first opening depends on a viscosity of the sealing compound.

11. The method of claim 5, wherein the gap is provided between the base plate and the coil form.

12. The method of claim 1, further comprising:

providing a rib on the outer side of the base plate to direct the sealing compound to the interface.

13. The method of claim 1, wherein the second opening is configured to receive the sealing compound and a latch.

14. The method of claim 13, further comprising providing a third opening which is configured for receiving the sealing compound.

15. The method of claim 14, wherein about one third by volume of the sealing compound is applied through the third opening and about two thirds by volume of the sealing compound is applied through the second opening.

16. The method of claim 6, wherein the uneven interior surface on the inner side of the base plate includes edges, channels and ribs.

* * * * *